(12) United States Patent
Latypov et al.

(10) Patent No.: US 9,305,834 B1
(45) Date of Patent: Apr. 5, 2016

(54) METHODS FOR FABRICATING INTEGRATED CIRCUITS USING DESIGNS OF INTEGRATED CIRCUITS ADAPTED TO DIRECTED SELF-ASSEMBLY FABRICATION TO FORM VIA AND CONTACT STRUCTURES

(71) Applicant: GLOBALFOUNDRIES, Inc., Grand Cayman (KY)

(72) Inventors: Azat Latypov, San Jose, CA (US); Ji Xu, San Jose, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/586,268

(22) Filed: Dec. 30, 2014

(51) Int. Cl.
G06F 17/50 (2006.01)
H01L 21/768 (2006.01)

(52) U.S. Cl.
CPC .............................. H01L 21/76816 (2013.01)

(58) Field of Classification Search
CPC .................... H01L 21/76816; H01L 21/0337; H01L 21/31144; H01L 21/76802
See application file for complete search history.

(56) References Cited

U.S. PATENT DOCUMENTS

| 8,667,428 B1 | 3/2014 | Latypov | |
|---|---|---|---|
| 8,667,430 B1 | 3/2014 | Latypov | |
| 2009/0200646 A1* | 8/2009 | Millward | ............ B81C 1/00031 257/632 |
| 2013/0196511 A1* | 8/2013 | Nishimura | ............. B82Y 40/00 438/712 |
| 2015/0118851 A1* | 4/2015 | Gao | ..................... H01L 21/0337 438/703 |
| 2015/0225850 A1* | 8/2015 | Arora | ................ C23C 16/45525 216/51 |

OTHER PUBLICATIONS

"Block Copolymer Directed Self-Assembly (DSA) Aware contact layer Optimization for 10nm 1D Standard Cell Library", by Yuelin Du, Daifeng Guo, Martin D.F. Wong, He Yi, H. -S. Phillip Wong, Hongbo Zhang, and Qiang Ma, @2013 IEEE.*

* cited by examiner

*Primary Examiner* — Nha Nguyen
(74) *Attorney, Agent, or Firm* — Ingrassia Fisher & Lorenz, P.C.

(57) ABSTRACT

Methods for fabricating integrated circuits using directed self-assembly to form via and contact holes are disclosed. An exemplary method includes determining a natural, hexagonal separation distance $L_0$ between cylinders formed in a block copolymer (BCP) material during directed self-assembly (DSA) and determining an integrated circuit feature pitch $P_A$ according to the following formula: $P_A = L_0 * (sqrt(3)/2) * n$, wherein n is a positive integer. The method further includes generating an integrated circuit layout design better accommodating the natural formation arrangement of polymeric cylinders, wherein integrated circuit features are spaced in accordance with the integrated circuit feature pitch $P_A$ and wherein via or contact structures are physically and electrically connected to the integrated circuit features and fabricating the integrated circuit features and the via or contact structures on a semiconductor work-in-process (WIP) in accordance with the integrated circuit layout design, wherein the via or contact structures are fabricated utilizing DSA with BCP material.

19 Claims, 9 Drawing Sheets

METHODS FOR FABRICATING INTEGRATED CIRCUITS USING DESIGNS OF INTEGRATED CIRCUITS ADAPTED TO DIRECTED SELF-ASSEMBLY FABRICATION TO FORM VIA AND CONTACT STRUCTURES

TECHNICAL FIELD

The technical field relates generally to methods for fabricating integrated circuits. More particularly, the technical field relates to methods for fabricating integrated circuits using directed self-assembly to form via and contact structures.

BACKGROUND

Decreasing device size and increasing device density has traditionally been a high priority for the manufacturing of integrated circuits. Optical lithography has been a driving force for device scaling. Conventional optical lithography is limited to about 80 nanometer (nm) pitch for single exposure patterning. While double and other multi-patterning processes can realize smaller pitch, these approaches are expensive and more complex.

Directed self-assembly (DSA), a technique that aligns self-assembling polymeric materials on a lithographically-defined directing or guide pattern, is a potential option for extending current lithography beyond its pitch and resolution limits. The self-assembling materials, for example, are block copolymers (BCPs) that include an "A" homopolymer covalently bonded to a "B" homopolymer, which are deposited over a lithographically-defined directing pattern on a semiconductor wafer-in-process or work-in-process (WIP). The lithographically-defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo micro-phase separation to form an A polymer region and a B polymer region that are registered to the underlying DSA directing pattern to define a nano-pattern (hereinafter "DSA pattern"). These A and B polymer regions are formed due to the intra- and inter-molecular forces exerted by the block copolymer macromolecules. The dimensions of these polymer regions are determined by the characteristic dimensions of the block copolymer molecules, resulting in a formation of structures with dimensions at a smaller scale compared to DSA directing patterns. Then, by removing either the A polymer block or the B polymer block by wet chemical or plasma-etch techniques, a mask is formed for transferring the DSA pattern to the underlying semiconductor WIP.

One DSA technique is graphoepitaxy in which self-assembly is directed by topographical features that are formed overlying a semiconductor WIP. This technique is used, for example, to create via and contact holes that can be subsequently filled with conductive material for forming electrical connections between one or more layers of the semiconductor WIP. In particular, the topographical features are formed overlying the semiconductor WIP using a photomask that defines mask features and conventional lithographic techniques to transfer the mask features to a photoresist layer that overlies the semiconductor WIP to form a patterned photoresist layer. The developed photoresist pattern can be used as is or further etched into underlying layers to form the topographical features that define confinement wells. By way of example, FIG. 1A illustrates a semiconductor WIP 101 that has a patterned photoresist material layer 102 formed thereover to define a plurality of confinement wells 103.

The confinement wells are filled with a BCP that is subsequently micro-phase separated to form, for example, selectively etchable cylinders or other etchable features that are each formed of either the A polymer region or the B polymer region of the BCP. The etchable cylinders are removed to form openings and define a mask for etch transferring the openings to the underlying semiconductor WIP for the formation of via and contact holes. By way of example, FIG. 1B illustrates the semiconductor WIP 101 of FIG. 1A after the confinement wells 103 have been filled with a BCP and after the BCP has micro-phase separated into a plurality of cylindrical polymer A regions 104 and polymer B regions 105 surrounding the polymer A regions 104.

In the absence of the confinement wells, cylindrical polymer regions formed in the BCP film in the manner described above typically self-assemble in hexagonally-arranged patterns, as shown in FIG. 2. Here and in the following, by a hexagon we mean a regular hexagon, that is a polygon with six vertices and six edges of equal lengths and with all internal angles equal to 120 degrees. A hexagonal overlay 200 is superimposed on the cylindrical polymer A regions 104 in FIG. 2 to better illustrate this configuration. The length of each side of the hexagonal overlay represents the natural, hexagonal separation distance between cylinders (defined from the center-point of each cylinder), which is commonly referred to in the art as separation distance $L_0$, as illustrated. It is often the case that the layout design of the via or contact structures of an integrated circuit does not fit well with such a hexagonal configuration. Confinement wells can be used to a limited extent to form more complex shapes and displace some of the cylinders from their natural hexagonal arrangement, but this approach is limited by the resolution of the confinement well patterning process, as described above. Thus, it is not always possible to match cylinder location with the exact via/contact hole layout design of the integrated circuit. By way of example, FIG. 3 illustrates a complex-shaped confinement well 303 that has been used to attempt to match a BCP cylinder pattern with a desired layout pattern. In FIG. 3, a plurality of cylinders 312 and 313 are illustrated in the confinement well 303, and the desired layout pattern is illustrated by a plurality of via/contact structures 311 on to the confinement well 303. As shown, cylinders 312 are undesirably out of alignment from via/contacts structures 311. Moreover, cylinders 313 are formed where no via/contact structure was intended. Only at locations 314, in this example, do the cylinders and the pattern layout of via/contact structures substantially line up. Thus, while confinement well 303 makes an attempt to match all cylinders with the desired pattern layout, the shortcomings of using only the confinement well to direct the cylinder placement are manifest.

Attempts have been made in the prior art to use DSA proximity correction techniques to further adjust the formation of cylinders by using various confinement well shapes to force the cylinders to deviate from their natural hexagonal arrangement. These attempts modify the formation of cylinders from their natural pattern to more closely match the desired layout design. The prior art is deficient, however, of any attempts to address the cylinder placement problem from the standpoint of the integrated circuit layout design as opposed to the confinement well design. That is, the prior has not yet sought to modify the integrated circuit layout design to better accommodate the natural (hexagonal) formation arrangement of polymeric cylinders.

Accordingly, it is desirable to provide methods for fabricating integrated circuits using DSA to form via and contact holes that more closely approximate the desired integrated circuit layout design. Additionally, it would be desirable to provide such methods that use "DSA-aware" integrated circuit layout designs to match the desired placement of via and contact holes with locations where polymeric cylinders are naturally formed (i.e., in hexagonal configurations). Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits using directed self-assembly to form via and contact structures are disclosed. In accordance with one exemplary embodiment, a method for fabricating an integrated circuit includes determining a natural, hexagonal separation distance $L_0$ between cylinders formed in a block copolymer (BCP) material during directed self-assembly (DSA) and determining an integrated circuit feature pitch $P_A$ according to the following formula: $P_A = L_0 * (sqrt(3)/2) * n$, wherein n is a positive integer. The method further includes generating an integrated circuit layout design wherein integrated circuit features are spaced in accordance with the integrated circuit feature pitch $P_A$ and wherein via or contact structures are physically and electrically connected to the integrated circuit features and fabricating the integrated circuit features and the via or contact structures on a semiconductor work-in-process (WIP) in accordance with the integrated circuit layout design, wherein the via or contact structures are fabricated utilizing DSA with the BCP material.

In accordance with another exemplary embodiment, a method for fabricating an integrated circuit includes determining an integrated circuit feature pitch $P_A$, wherein $P_A$ is greater than or equal to a minimum lithography pitch used to pattern confinement wells for enclosing a block copolymer (BCP) material during directed self-assembly (DSA) and generating an integrated circuit layout design wherein integrated circuit features are spaced in accordance with the integrated circuit feature pitch $P_A$ and wherein via or contact structures are physically and electrically connected to the integrated circuit features. The method further includes fabricating the integrated circuit features and the via or contact structures on a semiconductor work-in-process (WIP) in accordance with the integrated circuit layout design, wherein the via or contact structures are fabricated utilizing DSA with the BCP material.

In accordance with yet another exemplary embodiment, a method for fabricating an integrated circuit includes determining a natural, hexagonal separation distance $L_0$ between cylinders formed in a block copolymer (BCP) material during directed self-assembly (DSA), determining an integrated circuit feature pitch $P_A$ of a first layer of the integrated circuit as either greater than or equal to a minimum lithography pitch used to pattern confinement wells for enclosing the BCP material during DSA or equal to $L_0 * (sqrt(3)/2) * n$, wherein n is a positive integer, and determining an integrated circuit feature pitch $P_B$ of a second layer of the integrated circuit as equal to either $(L_0/2) * m$ or $L_0 * (sqrt(3)/2) * m$, wherein m is a positive integer selected independently from n, and wherein the first layer of the integrated circuit is disposed above or below the second layer of the integrated circuit. The method further includes generating an integrated circuit layout design wherein integrated circuit features of the first layer of the integrated circuit are spaced in accordance with the integrated circuit feature pitch $P_A$, wherein integrated circuit features of the second layer of the integrated circuit are spaced in accordance with the integrated circuit feature pitch $P_B$, and wherein via or contact structures are physically and electrically connected between the integrated circuit features of both the first and second layers of the integrated circuit and fabricating the integrated circuit features and the via or contact structures on a semiconductor work-in-process (WIP) in accordance with the integrated circuit layout design, wherein the via or contact structures are fabricated utilizing DSA with the BCP material.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Embodiments of the present disclosure are generally directed to methods for fabricating integrated circuits using directed self-assembly to form via and contact structures. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based memory structures are well-known and so, in the interest of brevity, many conventional steps will only be mentioned briefly herein or will be omitted entirely without providing the well-known process details.

The exemplary embodiments described herein provide for the fabrication of via and/or contact structures, which may be subsequently filled with conductive material to form conductive connecting structures (i.e., vias and contacts) of the integrated circuit. As is known in the art, the term "via" is generally used when referring to a conductive connecting structure that provides an electrical connection between two metallization layers, such as may be formed during back-end-of-line (BEOL) fabrication processes. Further, the term "contact" is generally used when referring to a conductive connecting structure that provides an electrical connection between an active integrated circuit structure, such as a transistor (i.e., the gate electrode or the source/drain areas thereof), and an overlying metallization layer. For ease of illustration, the Figures described in greater detail below illustrate certain embodiments in the context of fabricating a via structure, i.e., a conductive element between two metallization layers. However, it will be appreciated that these embodiments may be alternatively implemented in the context of fabricating a contact structure, i.e., a conductive element between an active integrated circuit structure and a metallization layer.

Figure 4:
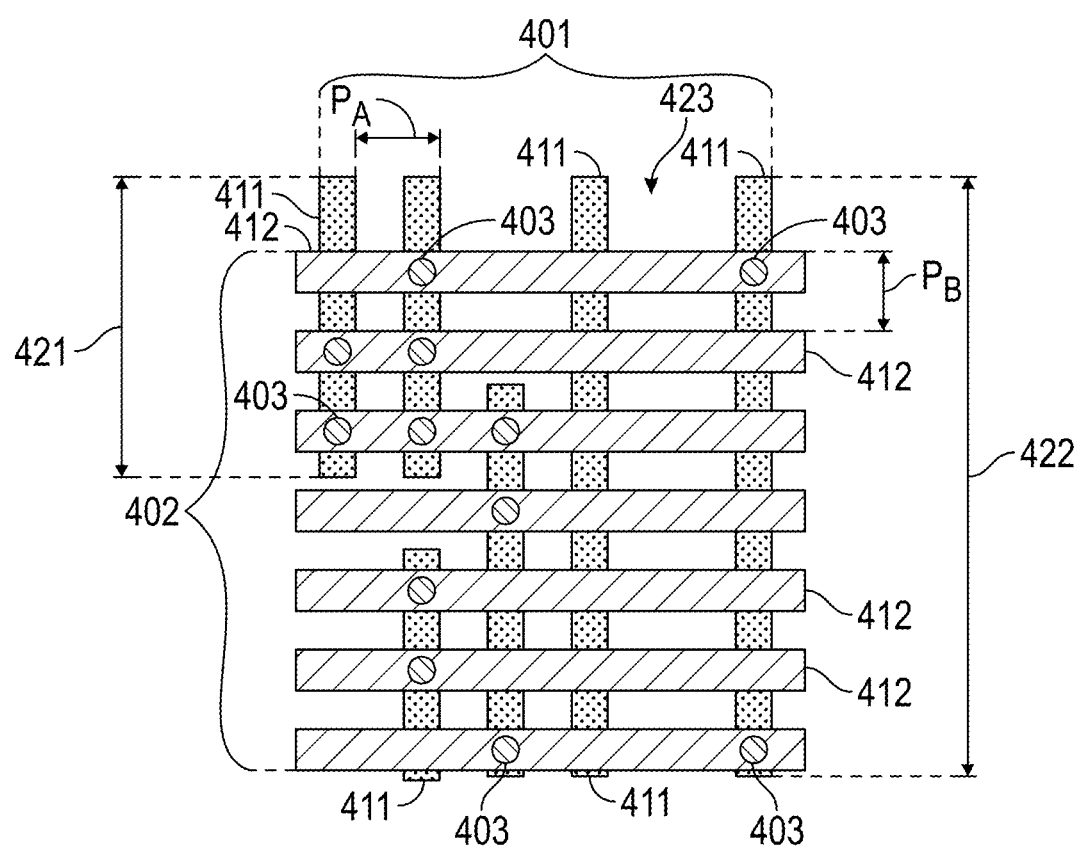
FIG. 4 illustrates an exemplary integrated circuit environment in which the various embodiments of the present disclosure may be implemented.

For example, FIG. 4 illustrates an exemplary integrated circuit environment in which the various embodiments of the present disclosure may be implemented. FIG. 4 generally illustrates a first layer 401 of an integrated circuit and a second layer 402 of the integrated circuit. Assuming that FIG. 4 is a top view of the layers 401 and 402, it will be appreciated that second layer 402 is disposed so as to be overlying first layer 401. Providing electrical connection between the layers 401 and 402 is a plurality of electrical connection structures 403, which in various embodiments may be either vias or contacts. Electrical connection structures 403 provide an electrical path connecting the layers 401 and 402. As used herein, it will be understood that when an element or layer, such as a BCP cylinder element or a photoresist layer, is referred to as being "on," "overlying," "connected to," or "coupled to" another element or layer, it may be directly on, overlying, connected to, or coupled to the other element or layer, or intervening elements or layers may be present. Further, spatially relative terms, such as "beneath," "below," "over," "under," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the integrated circuit layout design in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly. As noted above, in embodiments where structures 403 are vias, layers 401 and 402 are understood to be metallization layers (e.g., M1, M2, M3, etc.) of the integrated circuit. Thus, individual integrated circuit features 411, which are hereinafter referred to as integrated circuit feature "lines" 411 of layer 401, in this embodiment, are parallel conductive lines of a metallization layer. Further, individual feature lines 412 of layer 402 are parallel conductive lines of an overlying metallization layer. In embodiments where structures 403 are contacts, feature lines 411 of layer 401 may represent active features/structures of the integrated circuit, such as a gate electrode or source/drain structures, and feature lines 412 of layer 402 represent parallel conductive lines of an overlying metallization layer, such as M1.

As further illustrated in FIG. 4, the feature lines 411 of layer 401 and the feature lines 412 of layer 402 may run substantially perpendicularly with respect to one another, which is a common feature of modern integrated circuit design principles. As used herein, the term "substantially" refers to the complete, or nearly complete, extent or degree of an action, characteristic, property, state, structure, item, or result. As an arbitrary example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. In other examples, however, the feature lines 411 and 412 need not run perpendicularly with respect to one another, but may run at another angle, such as about 60 degrees as described in greater detail below in connection with FIG. 6. Of course, the feature lines need not all be the same length, and some may be not present or may be "missing." For example, layer 401 illustrates feature lines 411 of various lengths, i.e., compare length 421 with length 422 of feature lines 411. Moreover, at location 423, a feature line 411 is not present. Of course, it will be appreciated that feature lines 412, like 411, may be of various lengths or may be missing. The various lengths and presence of feature lines 411 and 412 will vary greatly depending on the particular integrated circuit design, and should not be understood as a limiting feature of the presently described embodiments.

As an additional matter, FIG. 4 illustrates an integrated circuit feature line pitch $P_A$ of the layer 401 and an integrated circuit feature line pitch $P_B$ of the layer 402. It is generally immaterial whether $P_A$ refers to the pitch of the overlying or the underlying layer, and the designation of one layer's pitch as $P_A$ and the other's as $P_B$ should not be understood as a limiting feature of the presently described embodiments. That is, the first layer 401 having feature pitch $P_A$ may, in various embodiments, be understood as being either above or below the second layer 402 having feature pitch $P_B$. As shown in FIG. 4, and as conventionally used in the art, the term "pitch" is used to define the separation distance between adjacent feature lines, wherein measuring the separation distance is performed at the same location of each line (i.e., the right-most edge thereof for lines 411 and the top-most edge thereof for lines 412 as shown in FIG. 4). When a feature line is not present, as at location 423 of FIG. 4, then the separation distance becomes $2*P_A$, and so on.

Various embodiments if the present disclosure will now be described in connection with FIGS. 5-9. It should be appreciated that the foregoing discussion of FIG. 4 concerning the exemplary semiconductor environment, e.g. line configuration and lengths, pitches, electrical connection structures, etc. is applicable to each of the following FIGS. 5-9, and as such the foregoing description will not be repeated with regard to each such Figure for brevity of discussion.

In various exemplary embodiments described below in connection with FIGS. 5-8, a "DSA-aware" integrated circuit layout design is created by setting $P_A$ equal to $L_0*(\text{sqrt}(3)/2)*n$, wherein n is a positive integer. Although from a strictly mathematical perspective the numerical value of "sqrt(3)/2" is ~0.866025, it should be appreciated that the described embodiments of the present disclosure, and consequently the claims, refer to "sqrt(3)/2" in an approximate sense and not as an exact value to any particular decimal place. This means that the exact value of ~0.866025 should be understood in all instances herein as including a certain tolerance "Δ" above or below the exact numerical value. The tolerance Δ is a value determined by those having ordinary skill in the art based on knowledge of particular DSA processes and BCP material selected for use, but may generally be within one of 20%, 10%, 5%, or 1% of the exact numerical value. For example, if the skilled artisan knows that a particular DSA process with a particular BCP tends to exhibit an approximate 10% variance from perfect geometric (hexagonal) order, then selecting $\Delta$ to be 10% of the exact numerical value of ~0.866025, and thus implying that the term "sqrt(3)/2" has a meaning of ~0.866025+/−10%, would be appropriate under such circumstances. In sum, the present disclosure should not be read as requiring a strict geometric ratio (i.e., exact numerical value of sqrt(3)/2) for implementation when the nature of DSA using BCP material typically does not allow for such stricture.

It is noteworthy that, unless otherwise specified in a particular embodiment, the methods described herein are independent of the specific order in which the steps are described. For purposes of illustration, the methods are described as a specific sequence of steps; however, it is to be understood that any number of permutations of the specified sequence of steps is possible, so long as the objective of the component repair being described is accomplished. Stated another way, the steps recited in any of the disclosed methods may be performed in any feasible order, and the methods of the invention are not limited to any particular order presented in any of the described embodiments, the examples, or the appended claims. Accordingly, as will be described in greater detail below in connection with FIGS. 5-8, an exemplary method for fabricating an integrated circuit includes determining the natural, hexagonal separation distance $L_0$ between cylinders formed in a block copolymer material during directed self-assembly (DSA). This determination may be made based upon the particular BCP material selection, various examples of which are provided in greater detail below. Moreover, the BCP material selection may be based on a desired $L_0$ distance, which may be pre-determined according to the constraints of the fabrication process or according to a desired integrated circuit layout spacing. That is, the IC design and angles may be first determined, and then the appropriate BCP material selected in accordance with such IC design. As initially noted above, the order of performing these steps in the methods is not critical. The exemplary method further includes determining the via or contact hole separation distance $P_A$ according to the following formula: $P_A = L_0 * (sqrt(3)/2) * n$, wherein n is a positive integer. Still further, the method further includes generating an integrated circuit layout design wherein vias or contact holes are separated in accordance with the via or contact hole separation distance $P_A$. In this regard, integrated circuit layout designs can be generated in several different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include the more recent Open Artwork System Interchange Standard (OASIS) proposed by Semiconductor Equipment and Materials International (SEMI), for example. These various industry formats are used to define the geometrical information in design layouts that are employed to manufacture integrated circuits.

Additionally, in various exemplary embodiment described below in connection with FIG. 9, a "DSA-aware" integrated circuit layout design is created by setting $P_A$ greater than or equal to the minimum lithography pitch used to pattern confinement wells for enclosing the block copolymer material during directed self-assembly. Accordingly, as will be described in greater detail below in connection with this Figure, a method for fabricating an integrated circuit includes determining the via or contact hole separation distance $P_A$ as greater than or equal to a minimum lithography pitch used to pattern confinement wells for enclosing a block copolymer material during directed self-assembly and generating an integrated circuit layout design wherein vias or contact holes are separated in accordance with the via or contact hole separation distance $P_A$.

Figure 5:
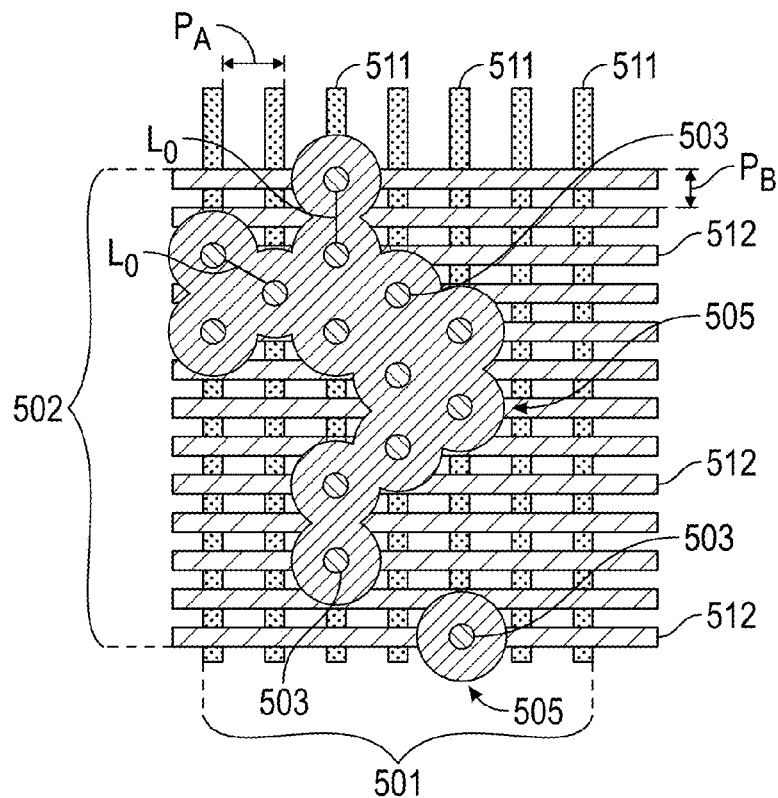
FIGS. 5-9 illustrate "DSA-aware" integrated circuit design principles with regard to the placement of via and contact structures in accordance with various exemplary embodiments of the present disclosure.

With particular reference now to FIG. 5, illustrated is a "DSA-aware" integrated circuit layout design in accordance with one exemplary embodiment of the present disclosure. The layout design includes a first layer 501 that includes a plurality of feature lines 511 and a second layer 502, overlying the first layer 501, which includes a plurality of feature lines 512, wherein the feature lines 511 and 512 run substantially perpendicularly with respect to one another. With regard to either of feature lines 511 or 512 (and as generally applicable to all of the following-described embodiments such as in FIGS. 6, 8, and 9), it will be appreciated that these feature lines are illustrated, for simplicity, without cuts, or without the terminating metal wires. Although the feature lines on these Figures are shown without cuts, the actual IC designs may include such cuts, or terminations of the metal wires, including the cuts or terminations that may make some of the metal wires absent or partially absent. The presence or absence of cuts does not affect the substance of the presently-disclosed embodiments, so they are drawn herein for simplicity without any cuts or wire terminations. The pitch of the feature lines 511, $P_A$, is set to equal $L_0 * (sqrt(3)/2) * n$, wherein n is a positive integer. In the illustrated embodiment, n is equal to 1, and as such $P_A$ equals $L_0 * (sqrt(3)/2)$. The pitch of the feature lines 512, $P_B$, is set to $(L_0/2) * m$, wherein m is a positive integer selected independently from n. In the illustrated embodiment, m is equal to 1, and as such $P_B$ equals $L_0/2$. Accordingly, the aforementioned exemplary method further includes determining an integrated circuit feature pitch $P_B$ for integrated circuit features of a second layer of the integrated circuit that is disposed above or below the first layer of the integrated circuit, wherein determining the integrated circuit feature pitch $P_B$ is performed according to the following formula: $P_B = (L_0/2) * m$, wherein m is a positive integer selected independently from n, which in this example is also 1. It should also be noted that for this embodiment and those that follow, selecting values of n and/or m higher than those specified may require the placement of "idle" or non-connected vias and contact structures between but not connected to either of feature lines, e.g. 511 and 512, as shown in FIG. 5. As used herein, the term "idle" via or contact structure refers to a via or contact structure that provides no electrical connection between overlying integrated circuit layers, and as such is connected to the line features of at most one integrated circuit layer. Electrically connecting the layers 501 and 502 are a plurality of via or contact structures 503, which are formed in a plurality of DSA confinement wells 505 that were previously patterned using conventional lithographic techniques.

Figure 1A:
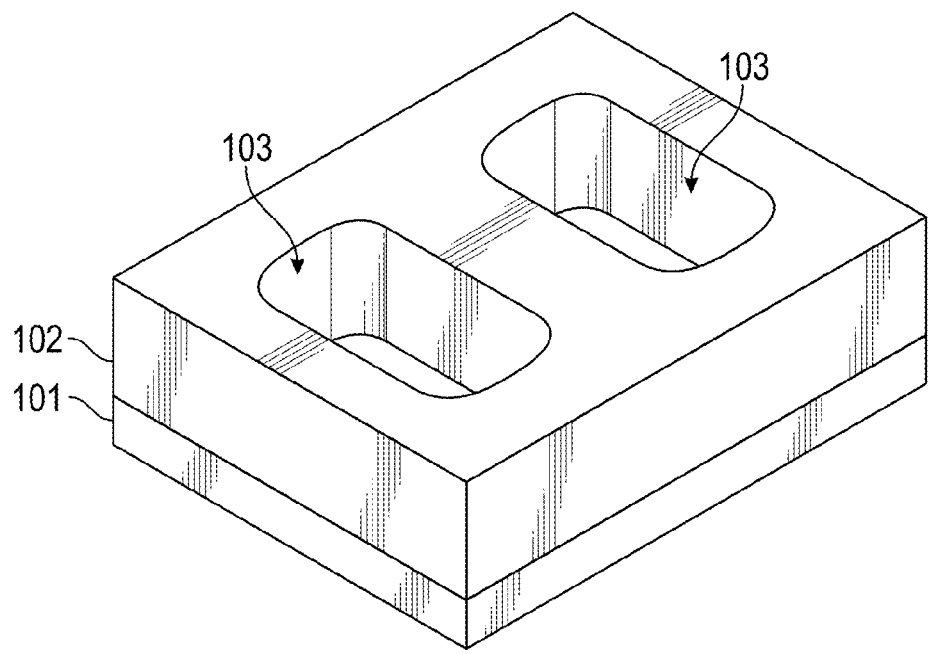
FIGS. 1A and 1B illustrate the formation of polymeric cylinders over a semiconductor WIP in accordance with processes known in the prior art.
Figure 1B:
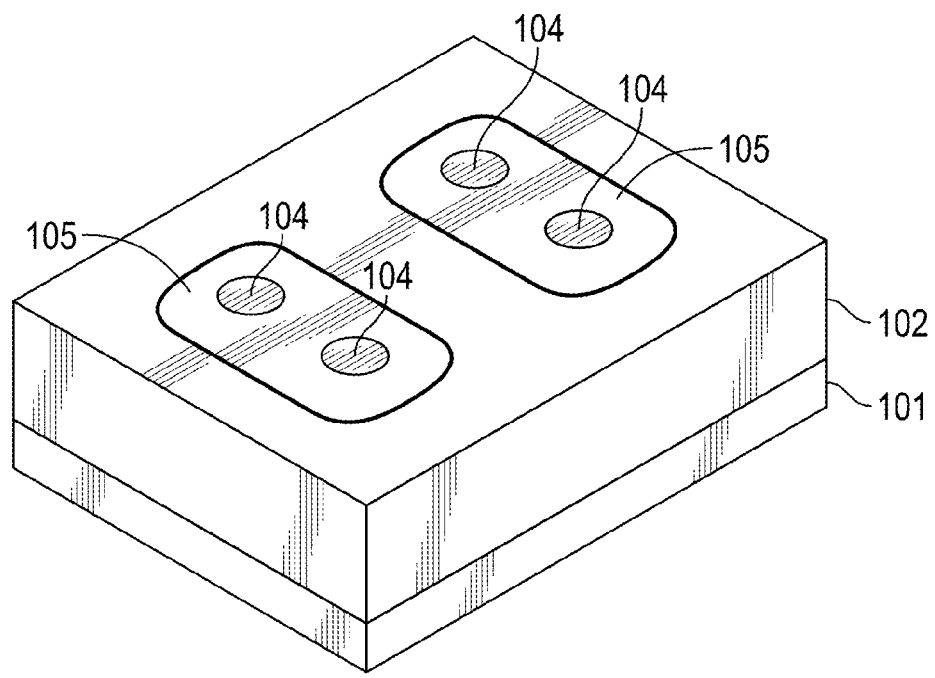
Figure 2:
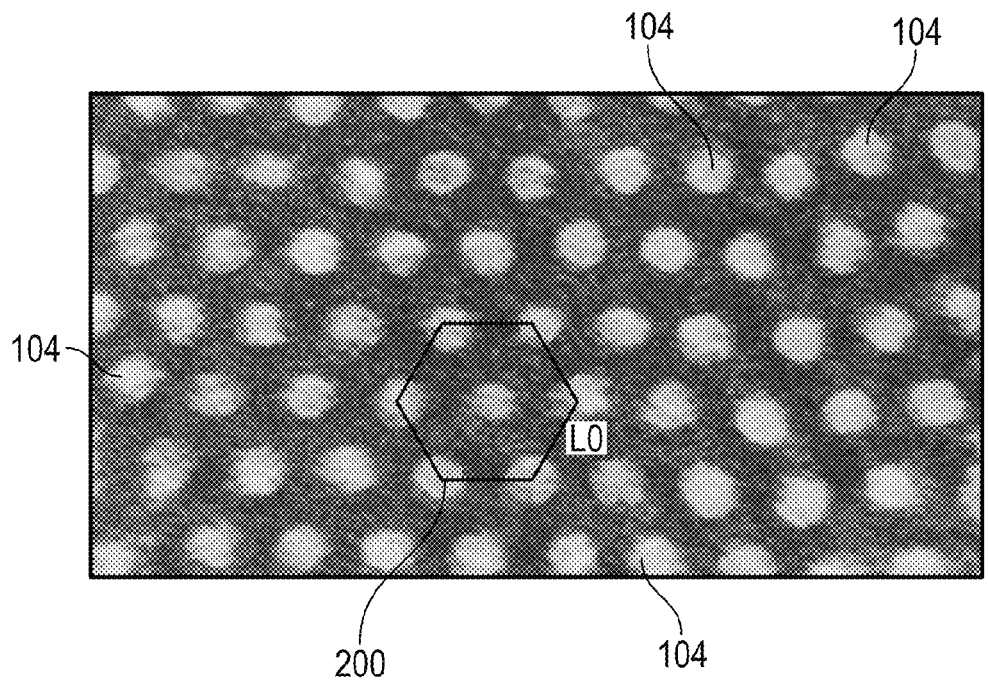
FIG. 2 illustrates the natural, hexagonal arrangement of polymeric cylinders as known in the prior art.
Figure 3:
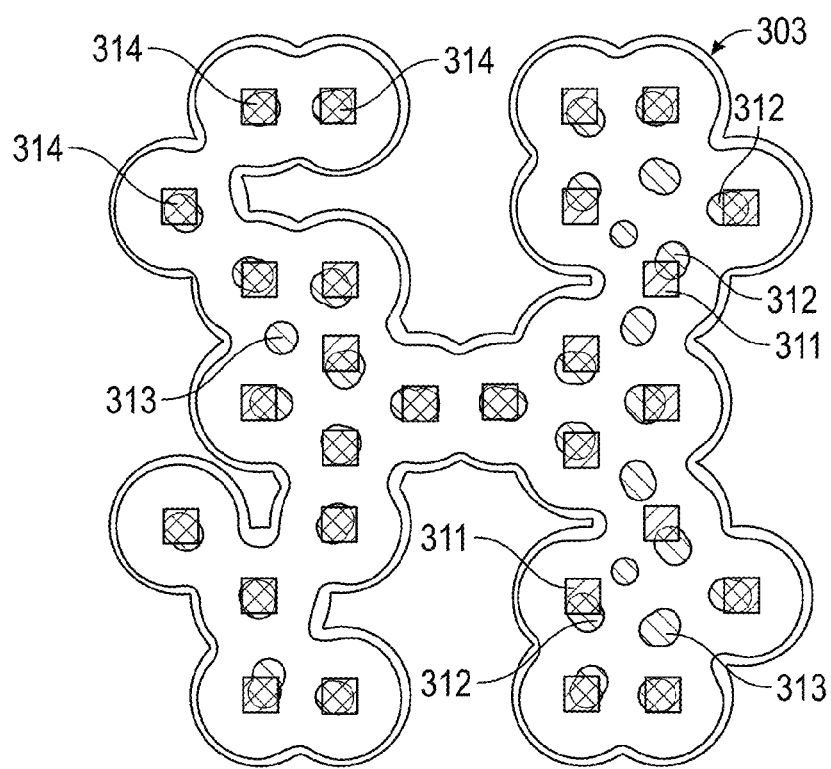
FIG. 3 illustrates the use of a complex-patterned confinement well to adjust the natural arrangement of polymeric cylinders to more closely match a desired integrated circuit design layout in accordance with processes known in the prior art.

From a geometric perspective (wherein elementary geometric principles teach that the perpendicular distance from a regular hexagon's side to its center-point is defined by the length of the side multiplied by sqrt(3)/2, and considering the natural, hexagon separation distance $L_0$ of the BCP cylinders, setting $P_A$ equal to $L_0 * (sqrt(3)/2)$ and $P_B$ equal to $L_0/2$ allows the placement of a via or contact structure 503 at an intersection of every other feature line 511 and 512. As used herein, the term "intersection" refers to the apparent crossing of two feature lines in two different layers when viewed from above, even though it is understood that the feature lines do not in fact actually touch one another; rather, a conductive via or contact structure is used to provide electrical connection between the lines at the point of intersection. Accordingly, as shown in FIG. 5, for a given line 511, a via or contact structure 503 may be placed at the intersection of every other feature line 512 thereover, and for a given line 512, a via or contact structure 503 may be placed at the intersection of every other feature line 511 thereunder. Whether a particular intersection has a via or contact structure providing electrical connection depends on the confinement well 505 pattern, which in turn depends on the integrated circuit layout design. Spacing the feature lines 511 and 512 according to the natural, hexagonal arrangement of the BCP cylinders, as opposed to attempting to fit the arrangement of the cylinders to a desired spacing, allows for the creation of a "DSA-aware" integrated circuit layout design that allows the BCP cylinders to form according to their natural order, and avoids prior art techniques that may resulting in the misalignment of vias or contacts as described above with regard to FIG. 3.

Figure 6:
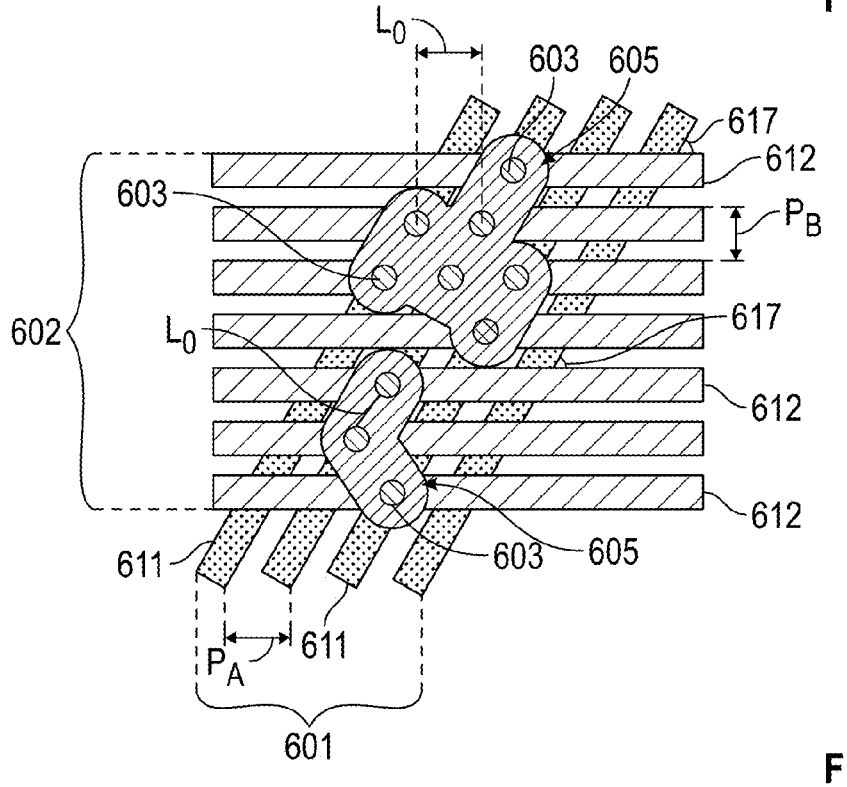

Referring now to FIG. 6, illustrated is a "DSA-aware" integrated circuit layout design in accordance with another exemplary embodiment of the present disclosure. The layout design includes a first layer 601 that includes a plurality of feature lines 611 and a second layer 602, overlying the first layer 601, which includes a plurality of feature lines 612. In this embodiment, the feature lines 611 and 612 do not run substantially perpendicularly with respect to one another, but rather the feature lines 611 are oriented in a first direction and the feature lines 612 are oriented in a second direction that is angled with respect to the first direction such that cylinders connected to the layer 601 and separated from one another by the separation distance $L_0$ are also connected to the second layer of the integrated circuit. Given the natural hexagonal arrangement of the BCP cylinders, this angle 617 will typically be from about 50 degrees to about 70 degrees, such as about 60 degrees. The pitch of the feature lines 611, $P_A$, is set to equal $L_0*(sqrt(3)/2)*n$, wherein n is a positive integer. In the illustrated embodiment, n is equal to 1, and as such $P_A$ equals $L_0*(sqrt(3)/2)$. The pitch of the feature lines 612, $P_B$, is set to $L_0*(sqrt(3)/2)*m$, wherein m is a positive integer selected independently from n. In this illustrated embodiment, m is equal to 1 and as such $P_B$ equals $L_0*(sqrt(3)/2)$. Electrically connecting the layers 601 and 602 are a plurality of via or contact structures 603, which are formed in a plurality of DSA confinement wells 605 that were previously patterned using conventional lithographic techniques.

From a geometric perspective, and considering the natural, hexagon separation distance $L_0$ of the BCP cylinders, setting $P_A$ equal to $L_0*(sqrt(3)/2)$ and $P_B$ equal to $L_0*(sqrt(3)/2)$ requires that the feature lines 611 and 612 be provided at the angle 617 of about 60 degrees with respect to one another in order for the BCP cylinders to naturally lie at intersections of the feature lines 611 and 612. In contrast to the embodiment of FIG. 5, however, placement of via or contact structures is possible at every intersection, not just every other intersection. Thus, whether a particular intersection has a via or contact structure providing electrical connection depends solely on the confinement well 605 pattern, which in turn depends on the integrated circuit layout design.

Figure 7A:
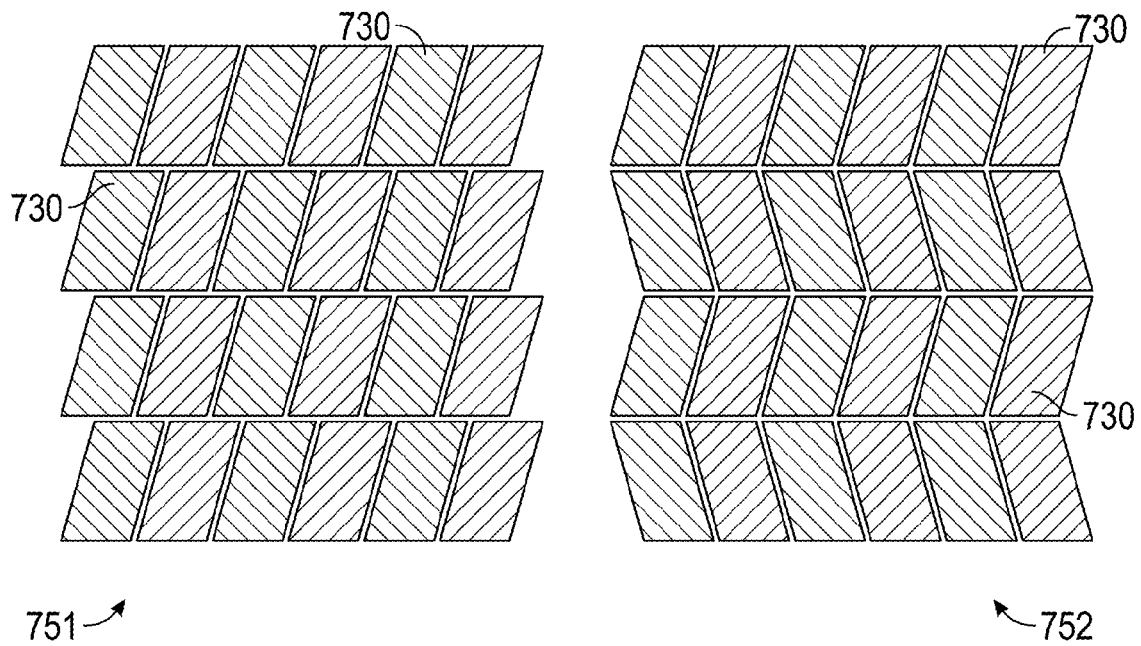

It is commonly known in the art that the grouping of related features of an integrated circuit are provided into modules known as "standard cells" or "cells." In prior art arrangements, cells are typically arranged adjacent to one another, wherein cells run at substantially right angles with respect to one another. Given the angle 617 required for the configuration illustrated in FIG. 6, however, the traditional cell pattern becomes difficult to realize. Accordingly, in an extension of the embodiment of the "DSA-aware" integrated circuit layout design illustrated in FIG. 6, FIG. 7A provides two exemplary cell arrangements 751 and 752, each of which includes a plurality of cells 730 that are suitable for use in connection with the integrated circuit layout design of FIG. 6. As shown in FIG. 7A, cell arrangement 751 provides a "staggered" cell design, wherein the edges of adjacent cells are not coterminous with one another but are staggered to allow each cell to run at the same angle. Cell arrangement 752 provides coterminous cells in a "wave" pattern, wherein adjacent cells run at mirror-image angles with respect to one another, as opposed to at the same angle as in arrangement 751. Other suitable cell arrangements may also be realized by those having ordinary skill in the art, and may be useful in connection with the layout design described above with regard to FIG. 6.

Figure 7B:
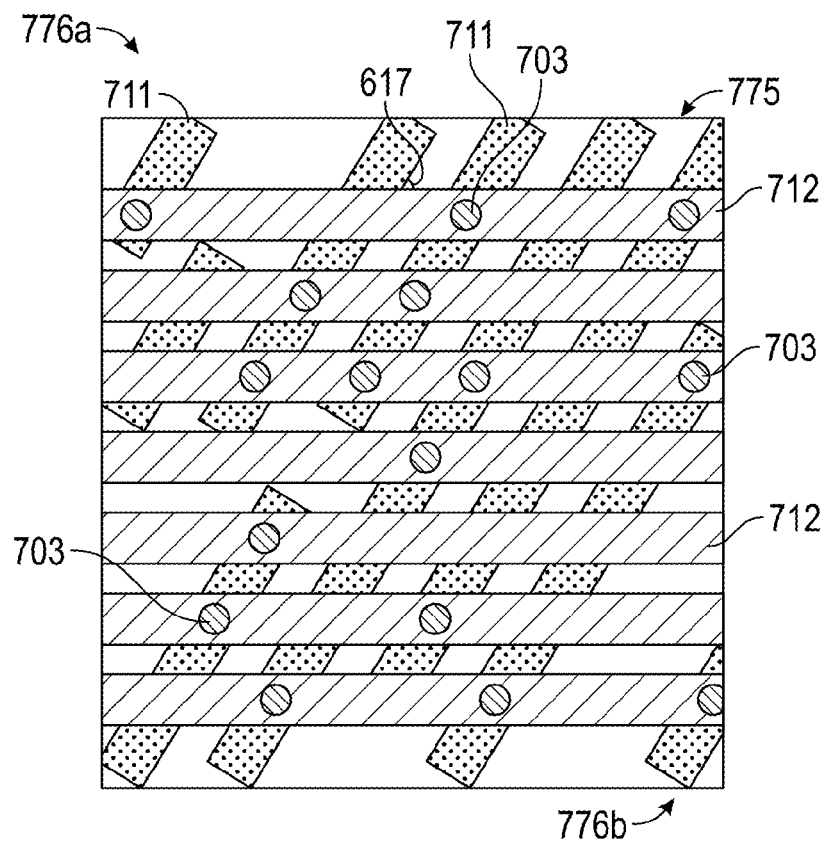

For example, in an alternative embodiment, as shown in FIG. 7B, illustrated is a representation of how a rectangular standard cell 775 can be designed, including feature lines 711 and 712, wherein the feature lines 711 run at the above-described angle 617. As shown, all features lines 711 and 712 are contained within the bounds of the standard cell 772, causing the feature lines 711 in corner regions 776a, 776b of the standard cell 775 to be shorter than those that run through the center of the standard cell (with increasing lengths possible from the corners to the center). Of course, it will be appreciated that feature lines 712, like 711, may be of various lengths or may be missing. Such rectangular standard cells 775 can be staggered as usual.

Figure 8:
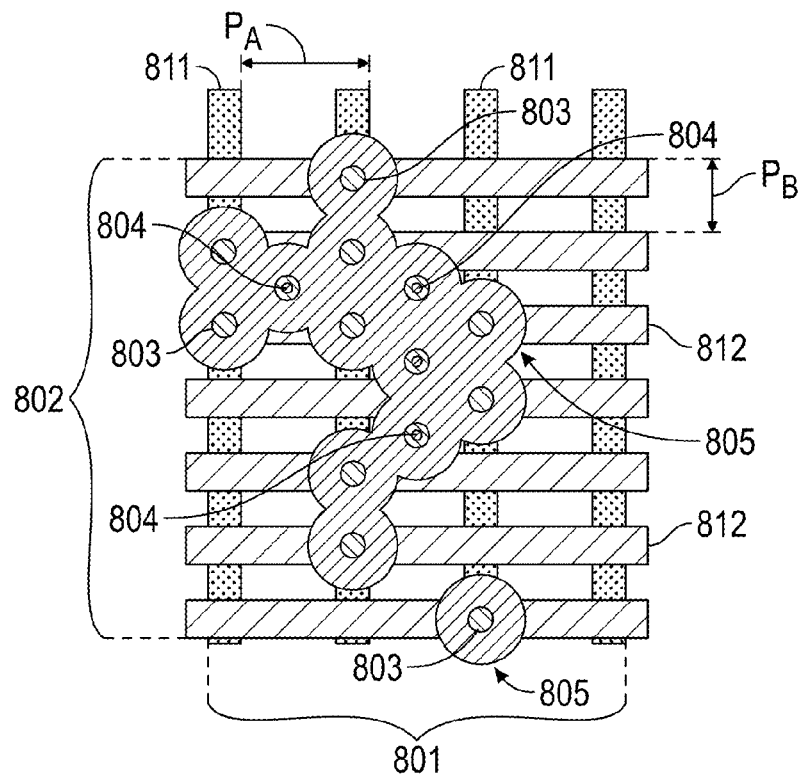

Referring now to FIG. 8, illustrated is a "DSA-aware" integrated circuit layout design in accordance with another exemplary embodiment of the present disclosure. The layout design includes a first layer 801 that includes a plurality of feature lines 811 and a second layer 802, overlying the first layer 801, which includes a plurality of feature lines 812. In this embodiment, the feature lines 811 and 812 run substantially perpendicularly with respect to one another. The pitch of the feature lines 811, $P_A$, is set to equal $L_0*(sqrt(3)/2)*n$, wherein n is a positive integer. In the illustrated embodiment, n is equal to 2, and as such $P_A$ equals $L_0*(sqrt(3))$. The pitch of the feature lines 812, $P_B$, is set to $(L_0/2)*m$, wherein m is a positive integer selected independently from n. In this illustrated embodiment, m is equal to 2, and as such $P_B$ equals $L_0$. Electrically connecting the layers 801 and 802 are a plurality of via or contact structures 803, which are formed in a plurality of DSA confinement wells 805 that were previously patterned using conventional lithographic techniques.

From a geometric perspective, and considering the natural, hexagon separation distance $L_0$ of the BCP cylinders, setting $P_A$ equal to $L_0*(sqrt(3))$ and $P_B$ equal to $L_0$ allows the placement of a via or contact structure 803 at every intersection between feature lines 811 and 812, but it also requires the placement of "idle" or non-connected vias and contact structures 804 between but not connected to either of feature lines 811 and 812, as shown in FIG. 8. As initially noted above, as used herein, the term "idle" via or contact structure refers to a via or contact structure that provides no electrical connection between overlying integrated circuit layers, and as such is connected to the line features of at most one integrated circuit layer. Accordingly, the exemplary method in accordance with the embodiment includes fabricating idle via or contact structures 804 on the semiconductor WIP that do not correspond with the via or contact structures 803 of the integrated circuit layout design and that are not connected with either or both of the integrated circuit feature lines 811, 812 of the first and second layers 801, 802 of the integrated circuit. Moreover, whether a particular intersection has a via or contact structure providing electrical connection depends on the confinement well 805 pattern, which in turn depends on the integrated circuit layout design.

Figure 9:
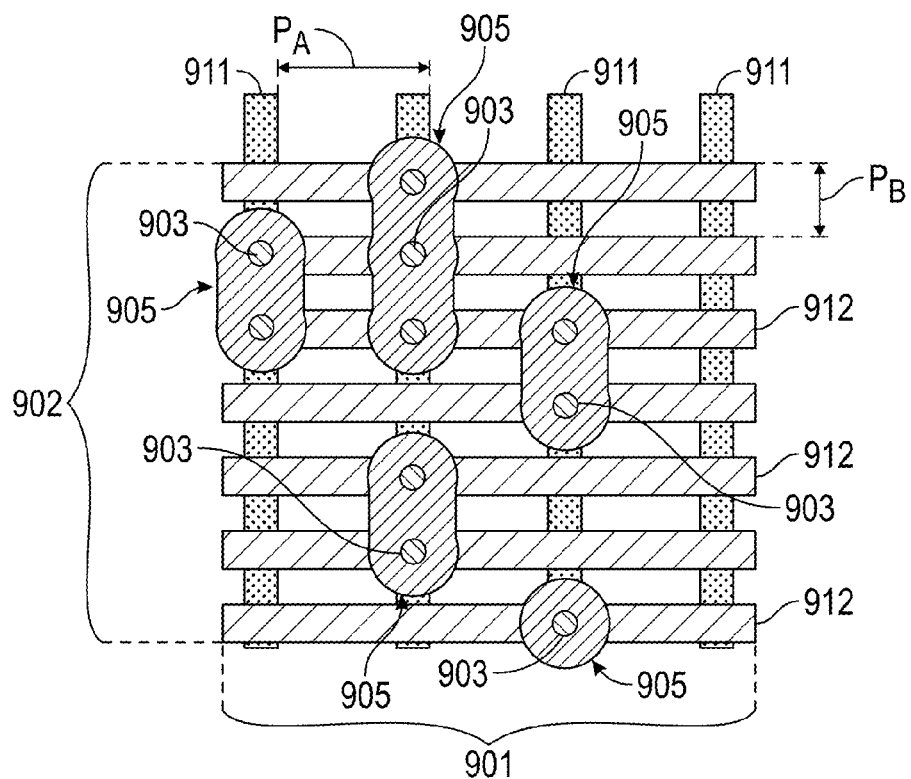

Referring now to FIG. 9, illustrated is a "DSA-aware" integrated circuit layout design in accordance with yet another exemplary embodiment of the present disclosure. The layout design includes a first layer 901 that includes a plurality of feature lines 911 and a second layer 902, overlying the first layer 901, which includes a plurality of feature lines 912. In this embodiment, the feature lines 911 and 912 run substantially perpendicularly with respect to one another. The pitch of the feature lines 911, $P_A$, is set to be greater than or equal to a minimum lithography pitch used to pattern confinement wells for enclosing a block copolymer (BCP) material during directed self-assembly (DSA). The minimum lithography pitch, in turn, depends to on the particular type of lithography employed, as will be discussed in greater detail below. The pitch of the feature lines 912, $P_B$, is set to ($L_0/2$)*m, wherein m is an even positive integer. In this illustrated embodiment, m is equal to 2, and as such $P_B$ equals $L_0$. Accordingly, the illustrated method includes determining the integrated circuit feature pitch $P_B$ according to the following formula: $P_B=(L_0/2)*m$, wherein m is an even positive integer, and in this example is equal to 2. Electrically connecting the layers 901 and 902 are a plurality of via or contact structures 903, which are formed in a plurality of DSA confinement wells 905 that were previously patterned using conventional lithographic techniques.

From a geometric perspective, and considering the minimum lithography pitch and the natural, hexagon separation distance $L_0$ of the BCP cylinders, setting $P_A$ equal to or greater than the minimum lithography pitch and $P_B$ equal to $L_0$ allows the placement of a via or contact structure 903 at every intersection between feature lines 911 and 912, but it also requires the confinement wells to be formed lengthwise along the feature lines 911. The confinement wells 905 are able to be formed in this manner as they are adequately separated from one another on parallel features lines 911 by at least the minimum lithography pitch used to form such well 905, and then the cylinders are left to form at their natural separation $L_0$ along these feature lines 911, wherein an intersection with feature lines 912 is conveniently provided at the same distance as $L_0$. Thus, whether a particular intersection has a via or contact structure providing electrical connection depends on the confinement well 905 pattern, which in turn depends on the integrated circuit layout design. Here again, spacing the feature lines 912 according to the distance between BCP cylinders in their natural, hexagonal arrangement, as opposed to attempting to fit the arrangement of the cylinders to a desired spacing, allows for the creation of a "DSA-aware" integrated circuit layout design that allows the BCP cylinders to form according to their natural order, and avoids prior art techniques that may resulting in the misalignment of vias or contacts.

With regard to all of the embodiments described herein above with respect to FIGS. 5-9, fabricating the integrated circuit in accordance with the foregoing "DSA-aware" design principles is described in greater detail with regard to FIGS. 10-15. That is, FIGS. 10-15 describe fabricating the integrated circuit features and the via or contact structures on the semiconductor WIP in accordance with the exemplary integrated circuit layout designs set forth above, wherein the via or contact structures are fabricated utilizing DSA with the BCP material.

Figure 10:
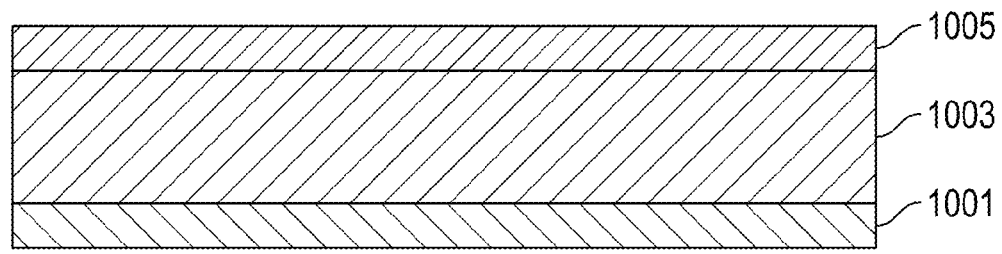
FIGS. 10-15 provide integrated circuit structures and methods for fabrication of integrated circuit structures using the "DSA-aware" integrated circuit design principles of FIGS. 5-9 in accordance with various exemplary embodiments of the present disclosure.

With reference first to FIG. 10, which provides a cross-sectional view through an exemplary integrated circuit WIP, an exemplary integrated circuit fabrication method includes forming a first layer 1001 that includes active integrated circuit features or a metallization layer using conventional fabrication techniques for forming active integrated circuit features (such as transistors) or for forming a metallization layer, depending on the content of the first layer. These conventional fabrication techniques are expected to be well-understood by those having ordinary skill in the art, and as such need not be repeated herein. First layer 1001 may be understood as corresponding to any of first layers 501, 601, 801, or 901 in the embodiments described above. In this regard, the pitch $P_A$ of the integrated circuit features therein may correspond with any of those described above with regard to FIGS. 5-9. The method further includes forming an interlayer dielectric (ILD) material layer 1003 overlying the first layer. The ILD material layer 1003 is formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The ILD material layer 1003 is formed using conventional deposition techniques, which depend on the particular material employed. In an exemplary embodiment, the ILD material layer 1003 includes a silicon oxide material and is formed by means of a chemical vapor deposition (CVD) process or a plasma-enhanced CVD process in which tetraethyl orthosilicate (TEOS) is used as a reactant. The method further includes depositing a photoresist material layer 1005 overlying the ILD material layer 1003.

Figure 11:
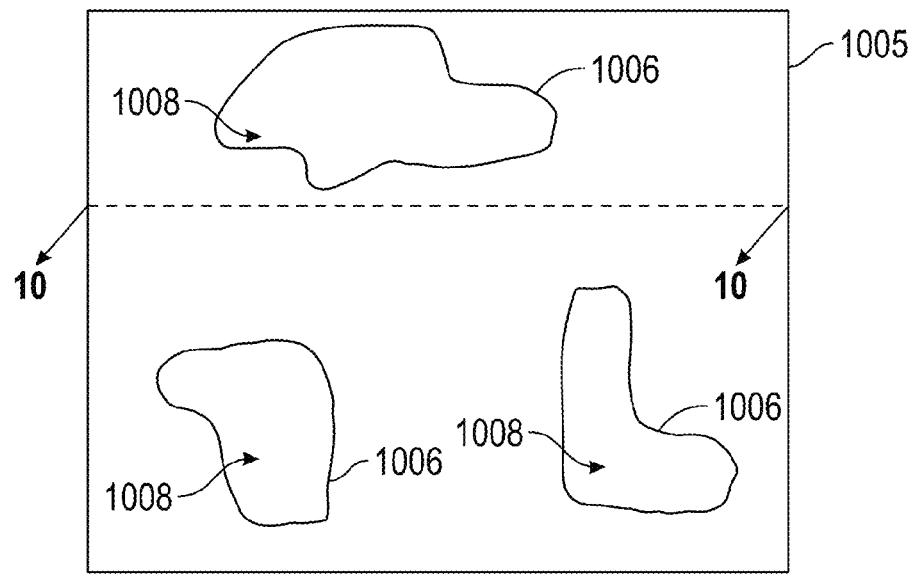

With attention now to FIG. 11, which provides a top view looking on to the photoresist material layer 1005, the exemplary method includes lithographically transferring from a photomask to the photoresist material layer 1005 a pattern 1006 using conventional photolithographic techniques as are known in the art. For example, the photoresist material layer 1005 is exposed to an image pattern corresponding with the photomask and treated with a developing solution to form a pattern opening within the photoresist layer corresponding to the pattern 1006. The pattern 1006 may be designed according to any of the embodiments described above with regard to FIGS. 5-9. The lithographic process employed may be optical, ultraviolet (UV), extreme ultraviolet (EUV), deep ultraviolet (DUV) or the like, as are known in the art. The patterned photoresist material layer 1005 is developed to form a plurality of topographical features such as confinement wells 1008 corresponding to the pattern 1006.

Figure 12:
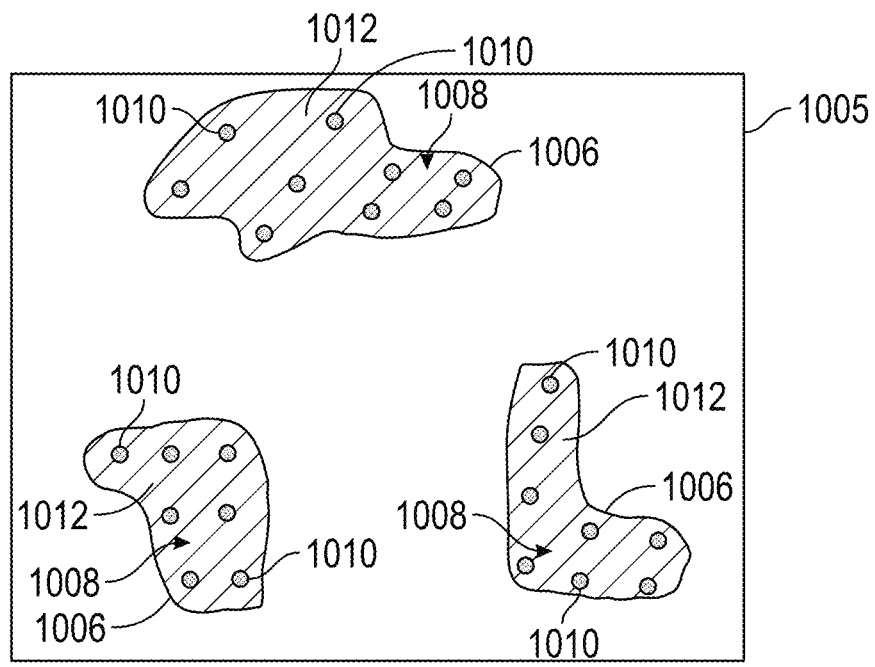

In an exemplary embodiment, with reference now to FIG. 12, the confinement wells 1008 are filled with the cylinder-forming block copolymer material. In an exemplary embodiment, the block copolymer material has A polymer blocks and B polymer blocks. Non-limiting examples of block copolymers include polystyrene-block-polymethylmethacrylate (PS-b-PMMA), polystyrene-block-polybutadiene (PS-b-PB), polystyrene-block-poly(2-vinyl pyridine) (PS-b-P2VP), polystyrene-block-polydimethylsiloxane (PS-b-PDMS), and polystyrene-block-polyethylene oxide (PS-b-PEO). The block copolymer is micro-phase separated into an etchable phase 1010 in the form of substantially cylindrical structures and an etch-resistant phase 1012 surrounding the substantially cylindrical structures of the etchable phase 1010.

Figure 13:
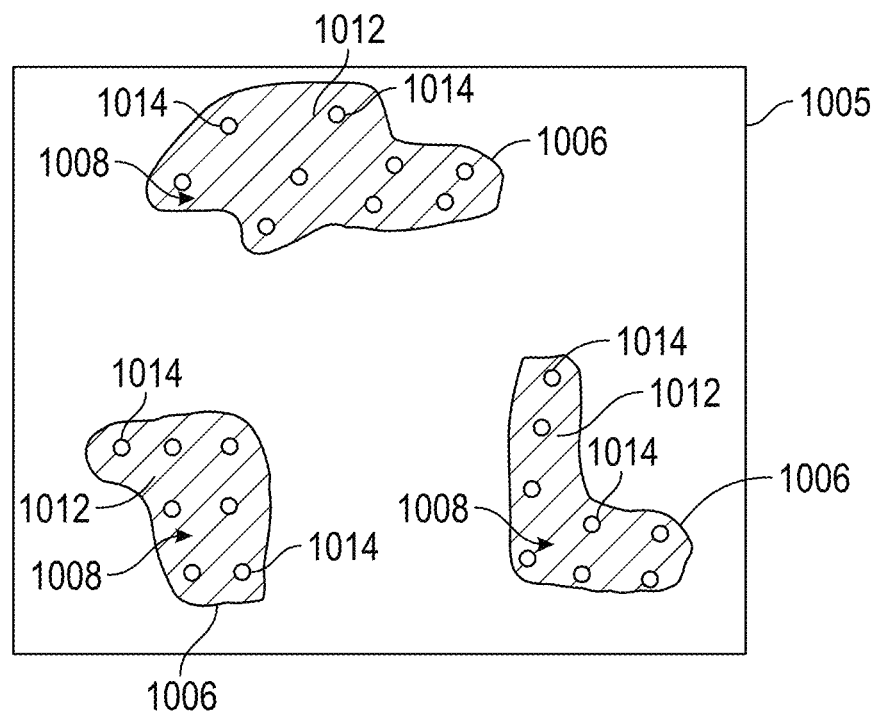
Figure 14:
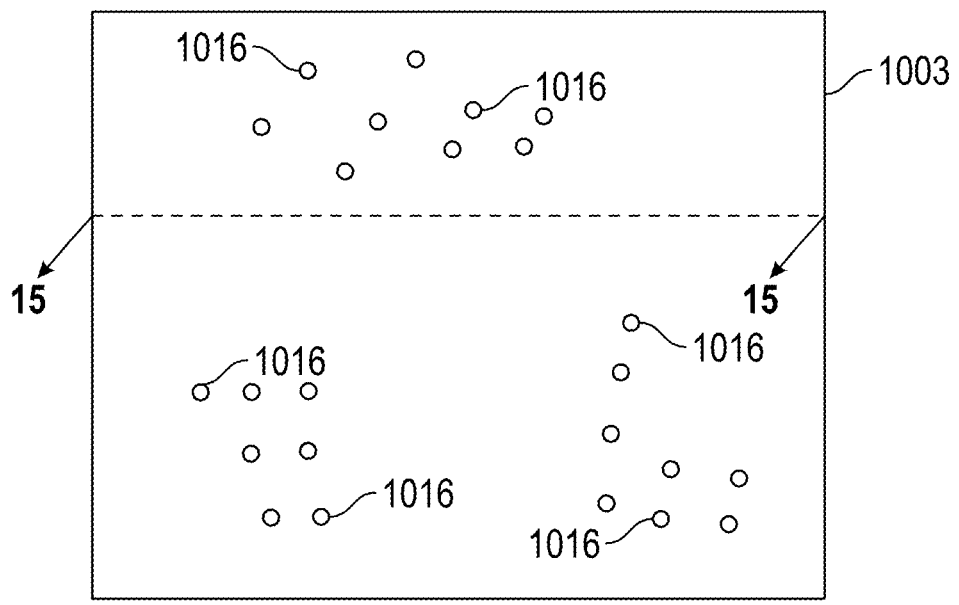
Figure 15:
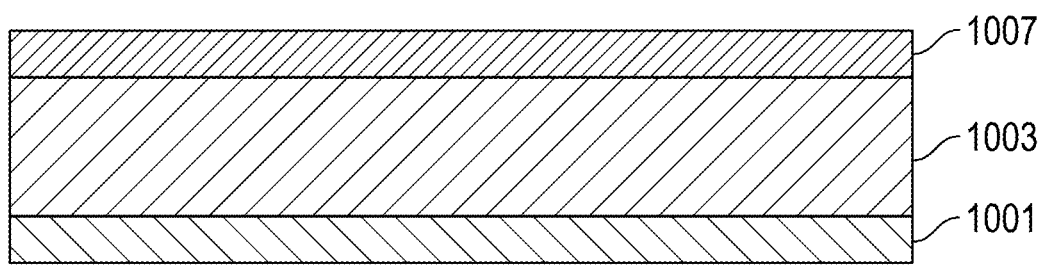

In an exemplary embodiment, as illustrated in FIG. 13, the block copolymer is etched to remove the etchable phase 1010 from the confinement wells 1008 to form a plurality of substantially cylindrical openings 1014 surrounded by the etch-resistant phase 1012. Using these openings 1014, the pattern of the cylindrical openings may be transferred into the underlying layer using any suitable etching technique, such as reactive ion etching (RIE). That is, using the openings 1014, corresponding openings 1016 may be transferred into the ILD material layer 1003. The remaining etch resistant phase 1012 and photoresist material layer are then removed using a different etching process or a planarization process, such as chemical mechanical planarization, to expose an upper surface of the ILD material layer 1003 including the openings 1016, as shown in FIG. 14. These openings 1016 may be filled with a conductive material, such as a copper material, an aluminum material, a tungsten material, or any other conductive material known to be useful in the fabrication of via or contact structures. As such, via or contact structures are formed in the openings 1016. It should also be noted that the embodiments of the present disclosure are compatible with the widely applied dual-damascene process used in back-end-of-line fabrication process, whether it is via first or trench first, as is generally understood by those having ordinary skill in the art.

Thereafter, with attention now to FIG. 15, which again provides a cross-sectional view through the exemplary integrated circuit WIP, the exemplary method includes forming a second layer 1007 that includes a metallization layer using conventional fabrication techniques for forming a metallization layer, such as damascene processes in the case of a copper material being utilized as the metallization layer. Second layer 1007 may be understood as corresponding to any of second layers 502, 602, 802, or 902 in the embodiments described above. In this regard, the pitch $P_B$ of the integrated circuit features therein may correspond with any of those described above with regard to FIGS. 5-9. Accordingly, the integrated circuit structure shown in FIG. 15 includes the first layer 1001 having included therein integrated circuit features, the ILD material layer 1003 having included therein via or contact structures electrically connected with the integrated circuit features of the first layer 1001 (the via or contact structures being formed within the openings 1016 shown in FIG. 14), and the second layer 1007 having included therein integrated circuit features that are also electrically connected with the via or contact structures, thus providing an operable electrical connection between the integrated circuit features of the first layer 1001 and the integrated circuit features of the second layer 1007, for example.

Accordingly, exemplary embodiments of methods for fabricating integrated circuits using directed self-assembly to form via and contact structures have been described. The described embodiments provide methods for fabricating integrated circuits using DSA to form via and contact structures that more closely approximate the desired integrated circuit layout design. The described embodiments further provide such methods that use DSA-aware integrated circuit layout designs to match the desired placement of via and contact structures with locations where selectively etchable polymeric cylinders are naturally formed (i.e., in hexagonal configurations) in DSA processes. Providing the integrated circuit layout designs in accordance with the natural, hexagonal arrangement of the BCP cylinders, as opposed to attempting to fit the arrangement of the cylinders to a desired layout design, allows for the creation of a DSA-aware integrated circuit layout design that allows the BCP cylinders to form according to their natural order, and avoids prior art techniques that may resulting in the misalignment of vias or contact.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   determining a natural, hexagonal separation distance $L_0$ between cylinders formed in a block copolymer (BCP) material during directed self-assembly (DSA);
   determining an integrated circuit feature pitch $P_A$ according to the following formula:

$$P_A = L_0 * (\mathrm{sqrt}(3)/2) * n, \text{ wherein } n \text{ is a positive integer;}$$

generating an integrated circuit layout design wherein integrated circuit features are spaced in accordance with the integrated circuit feature pitch $P_A$ and wherein via or contact structures are physically and electrically connected to the integrated circuit features; and
   fabricating the integrated circuit features and the via or contact structures on a semiconductor work-in-process (WIP) in accordance with the integrated circuit layout design, wherein the via or contact structures are fabricated utilizing DSA with the BCP material.

2. The method of claim 1, wherein determining the separation distance $L_0$ comprises determining the separation distance $L_0$ between cylinders formed in a BCP material comprising polystyrene-block-polymethylmethacrylate (PS-b-PMMA), polystyrene-block-polybutadiene (PS-b-PB), polystyrene-block-poly(2-vinyl pyridine) (PS-b-P2VP), polystyrene-block-polydimethylsiloxane (PS-b-PDMS), or polystyrene-block-polyethylene oxide (PS-b-PEO).

3. The method of claim 1, wherein generating the integrated circuit layout design comprises generating the integrated circuit layout design wherein parallel conductive lines of a metallization layer are spaced in accordance with the integrated circuit feature pitch $P_A$.

4. The method of claim 1, wherein generating the integrated circuit layout design comprises generating the integrated circuit layout design wherein active integrated circuit structures are spaced in accordance with the integrated circuit feature pitch $P_A$.

5. The method of claim 1, wherein determining the integrated circuit feature pitch $P_A$ comprises determining the integrated circuit feature pitch $P_A$ according to the formula:

$$P_A = L_0 * (\mathrm{sqrt}(3)/2) * n, \text{ wherein } n \text{ is } 1.$$

6. The method of claim 5, wherein determining the integrated circuit feature pitch $P_A$ is performed for integrated circuit features of a first layer of the integrated circuit, wherein the method further comprises determining an integrated circuit feature pitch $P_B$ for integrated circuit features of a second layer of the integrated circuit that is disposed above or below the first layer of the integrated circuit, wherein determining the integrated circuit feature pitch $P_B$ is performed according to the following formula: $P_B = (L_0/2) * m$, wherein m is a positive integer selected independently from n, and wherein the method further comprises generating the integrated circuit layout design wherein integrated circuit features of the first layer of the integrated circuit are spaced in accordance with the integrated circuit feature pitch $P_A$ and integrated circuit features of the second layer of the integrated circuit are spaced in accordance with the integrated circuit feature pitch $P_B$.

7. The method of claim 6, wherein determining the integrated circuit feature pitch $P_B$ comprises determining the integrated circuit feature pitch $P_B$ according to the formula:

$P_B=(L_0/2)*m$, wherein $m$ is 1.

8. The method of claim 5, wherein determining the integrated circuit feature pitch $P_A$ is performed for integrated circuit features of a first layer of the integrated circuit, wherein the method further comprises determining an integrated circuit feature pitch $P_B$ for integrated circuit features of a second layer of the integrated circuit that is disposed above or below the first layer of the integrated circuit, wherein determining the integrated circuit feature pitch $P_B$ is performed according to the following formula: $P_B=L_0*(sqrt(3)/2)*m$, wherein m is a positive integer selected independently from n, and wherein the method further comprises generating the integrated circuit layout design wherein integrated circuit features of the first layer of the integrated circuit are spaced in accordance with the integrated circuit feature pitch $P_A$ and integrated circuit features of the second layer of the integrated circuit are spaced in accordance with the integrated circuit feature pitch $P_B$.

9. The method of claim 8, wherein determining the integrated circuit feature pitch $P_B$ comprises determining the integrated circuit feature pitch $P_B$ according to the formula:

$P_B=L_0*(sqrt(3)/2)*m$, wherein $m$ is 1.

10. The method of claim 8, wherein generating the integrated circuit layout design comprises generating the integrated circuit layout design such that the integrated circuit features of the first layer of the integrated circuit are oriented in a first direction and such that the integrated circuit features of the second layer are oriented in a second direction that is angled with respect to the first direction such that cylinders connected to the first layer of the integrated circuit and separated from one another by the separation distance $L_0$ are also connected to the second layer of the integrated circuit.

11. The method of claim 10, wherein generating the integrated circuit layout design comprises generating the integrated circuit layout design such that the integrated circuit features of the second layer are oriented in the second direction that is angled at about 50 to about 70 degrees with respect to the first direction.

12. The method of claim 1, wherein determining the integrated circuit feature pitch $P_A$ comprises determining the integrated circuit feature pitch $P_A$ according to the formula:

$P_A=L_0*(sqrt(3)/2)*n$, wherein $n$ is 2.

13. The method of claim 12, wherein determining the integrated circuit feature pitch $P_A$ is performed for integrated circuit features of a first layer of the integrated circuit, wherein the method further comprises determining an integrated circuit feature pitch $P_B$ for integrated circuit features of a second layer of the integrated circuit that is disposed above or below the first layer of the integrated circuit, wherein determining the integrated circuit feature pitch $P_B$ is performed according to the following formula: $P_B=(L_0/2)*m$, wherein m is a positive integer selected independently from n, and wherein the method further comprises generating the integrated circuit layout design wherein integrated circuit features of the first layer of the integrated circuit are spaced in accordance with the integrated circuit feature pitch $P_A$ and integrated circuit features of the second layer of the integrated circuit are spaced in accordance with the integrated circuit feature pitch $P_B$.

14. The method of claim 13, wherein determining the integrated circuit feature pitch $P_B$ comprises determining the integrated circuit feature pitch $P_B$ according to the formula:

$P_B=(L_0/2)*m$, wherein $m$ is 1.

15. A method for fabricating an integrated circuit comprising:
determining an integrated circuit feature pitch $P_A$, wherein $P_A$ is greater than or equal to a minimum lithography pitch used to pattern confinement wells for enclosing a block copolymer (BCP) material during directed self-assembly (DSA);
generating an integrated circuit layout design wherein integrated circuit features are spaced in accordance with the integrated circuit feature pitch $P_A$ and wherein via or contact structures are physically and electrically connected to the integrated circuit features; and
fabricating the integrated circuit features and the via or contact structures on a semiconductor work-in-process (WIP) in accordance with the integrated circuit layout design, wherein the via or contact structures are fabricated utilizing DSA with the BCP material,
wherein determining the integrated circuit feature pitch $P_A$ is performed for integrated circuit features of a first layer of the integrated circuit, wherein the method further comprises determining an integrated circuit feature pitch $P_B$ for integrated circuit features of a second layer of the integrated circuit that is disposed above or below the first layer of the integrated circuit, wherein determining the integrated circuit feature pitch $P_B$ is performed according to the following formula: $P_B=(L_0/2)*m$, wherein m is a positive integer, and wherein the method further comprises generating the integrated circuit layout design wherein integrated circuit features of the first layer of the integrated circuit are spaced in accordance with the integrated circuit feature pitch $P_A$ and integrated circuit features of the second layer of the integrated circuit are spaced in accordance with the integrated circuit feature pitch $P_B$.

16. The method of claim 15, wherein determining the integrated circuit feature pitch $P_A$ comprises determining the integrated circuit feature pitch $P_A$ in accordance with the minimum lithography pitch of optical lithography, ultraviolet (UV) lithography, extreme ultraviolet (EUV) lithography, or deep ultraviolet (DUV) lithography.

17. A method for fabricating an integrated circuit comprising:
determining a natural, hexagonal separation distance $L_0$ between cylinders formed in a block copolymer (BCP) material during directed self-assembly (DSA);
determining an integrated circuit feature pitch $P_A$ of a first layer of the integrated circuit as either greater than or equal to a minimum lithography pitch used to pattern confinement wells for enclosing the BCP material during DSA or equal to $L_0*(sqrt(3)/2)*n$, wherein n is a positive integer;
determining an integrated circuit feature pitch $P_B$ of a second layer of the integrated circuit as equal to either $(L_0/2)*m$ or $L_0*(sqrt(3)/2)*m$, wherein m is a positive integer selected independently from n, and wherein the first layer of the integrated circuit is disposed above or below the second layer of the integrated circuit;
generating an integrated circuit layout design wherein integrated circuit features of the first layer of the integrated circuit are spaced in accordance with the integrated circuit feature pitch $P_A$, wherein integrated circuit features of the second layer of the integrated circuit are spaced in accordance with the integrated circuit feature pitch $P_B$, and wherein via or contact structures are physically and electrically connected between the integrated circuit features of both the first and second layers of the integrated circuit; and fabricating the integrated circuit features and the via or contact structures on a semiconductor work-in-process (WIP) in accordance with the integrated circuit layout design, wherein the via or contact structures are fabricated utilizing DSA with the BCP material.

18. The method of claim 17, wherein fabricating the via or contact structures utilizing DSA with the BCP material comprises patterning a photoresist layer that overlies the semiconductor WIP using lithography to form a patterned photoresist layer, selectively etching the photoresist layer to form topographical features that define confinement wells in the photoresist layer, filling the confinement wells with the BCP material, micro-phase separating the BCP material by thermal processing to form the cylinders in the BCP material, removing the cylinders in the BCP material to form openings in the BCP material and to define a mask for etch transferring the openings to the semiconductor WIP for the formation of via or contact holes, and filling the via or contact holes with a conductive material to form the via or contact structures.

19. The method of claim 17, further comprising fabricating idle via or contact structures on the semiconductor WIP that do not correspond with the via or contact structures of the integrated circuit layout design and that are not connected with either or both of the integrated circuit features of the first and second layers of the integrated circuit.

\* \* \* \* \*